United States Patent
Cebenko et al.

(10) Patent No.: US 6,781,170 B2
(45) Date of Patent: Aug. 24, 2004

(54) INTEGRATED CIRCUIT BASE TRANSISTOR STRUCTURE AND ASSOCIATED PROGRAMMABLE CELL LIBRARY

(75) Inventors: Stephen R. Cebenko, New Tripoli, PA (US); David A. Rhein, Reading, PA (US); John A. Schadt, Bethlehem, PA (US); Brian W. Yeager, Schuykill Haven, PA (US); Warren L. Ziegenfus, Emmaus, PA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 137 days.

(21) Appl. No.: 10/082,050

(22) Filed: Feb. 14, 2002

(65) Prior Publication Data

US 2002/0163048 A1 Nov. 7, 2002

Related U.S. Application Data

(60) Provisional application No. 60/287,900, filed on May 1, 2001.

(51) Int. Cl.$^7$ ............................................. H01L 31/062
(52) U.S. Cl. ........................ 257/292; 257/291; 257/315; 257/355
(58) Field of Search ................................ 257/292, 315, 257/355, 401, 291

(56) References Cited

U.S. PATENT DOCUMENTS

| | | | | |
|---|---|---|---|---|
| 4,716,314 A | * | 12/1987 | Mulder et al. | 326/100 |
| 5,461,577 A | * | 10/1995 | Shaw et al. | 716/17 |
| 5,731,614 A | * | 3/1998 | Ham | 257/355 |
| 6,521,926 B1 | * | 2/2003 | Sasaki | 257/292 |
| 2002/0167042 A1 | * | 11/2002 | Angle et al. | 257/315 |

OTHER PUBLICATIONS

U.S. patent application Ser. No. 09/400,029, J.A. Schadt, "Integrated Circuit with Standard Cell Logic and Spare Gates," filed Sep. 21, 1999.

* cited by examiner

*Primary Examiner*—David Nelms
*Assistant Examiner*—Dao H. Nguyen

(57) ABSTRACT

A base transistor structure and associated programmable cell library compatible with standard cell computer-aided design (CAD) tools are disclosed. In an illustrative embodiment of the invention, the base transistor structure is symmetric about one or more axes, and extends only a single grid of a standard cell CAD tool in width. The base transistor structure is advantageously configured in a manner that permits the utilization of gate isolation to separate active transistors in adjacent base transistor structures. The base transistor structure can be used to implement a programmable cell technology that is fully compatible with standard cell CAD tools.

19 Claims, 4 Drawing Sheets

INTEGRATED CIRCUIT BASE TRANSISTOR STRUCTURE AND ASSOCIATED PROGRAMMABLE CELL LIBRARY

PRIORITY CLAIM

The present application claims the priority of U.S. Provisional Application Ser. No. 60/287,900 filed May 1, 2001 and entitled "Integrated Circuit Base Transistor Structure and Associated Programmable Cell Library."

FIELD OF THE INVENTION

The present invention relates generally to integrated circuits and integrated circuit design processes, and more particularly to a base transistor structure that may be used to implement programmable cells in integrated circuits.

BACKGROUND OF THE INVENTION

Standard cell application-specific integrated circuits (ASICs) provide a number of significant advantages over other types of integrated circuits, including more manageable die size, lower piece-part cost, higher performance, and more reliable design flow. The standard cell approach is generally considered preferable to other competing approaches such as custom design and programmable logic. As a result, most existing integrated circuit computer-aided design (CAD) tools, such as place and route tools, are configured for operation with the standard cell approach. In general, CAD tools designed for programmable logic are often incompatible with standard cell tools and may require specially trained experts.

One potential problem associated with the standard cell approach is that non-recurring expense (NRE) and process cycle time for development of a given design may still be unduly high. The principal components of the NRE are the cost of a new lot start and the cost of a new mask set as required to implement changes in a standard cell design. As the transistor technology shrinks in size, the lot start and mask set costs can increase considerably. With regard to process cycle time, ASICs typically undergo several design iterations before qualifying for full production. Reaching production with pure standard cell technology can thus be costly and time consuming at a time when market forces are squeezing costs and shortening development cycles.

A number of techniques have been developed in an attempt to alleviate the above-noted problem of the standard cell approach.

One such technique involves the use of so-called multi-chip shuttles to amortize the lot start and mask set costs over several chips. Basically, a prototype lot is ordered for model production only where there may be four to six individual chips placed on the same wafer and reticle. The drawbacks of this technique include a limited die size for each constituent chip, difficulty in timing and coordination of mask order and other functions across four to six chip projects, and potential saw-apart and packaging problems.

Another known technique involves the embedding of spare standard cell gates in a chip netlist to be used at a later time for design changes. However, these spare gates are generally hand-instantiated into the netlist by the customer, the level of design change supported is extremely limited, and wiring the change into the design can be difficult due to poor cell placement.

A third technique involves embedding programmable logic within a standard cell ASIC. However, as mentioned previously, programmable logic generally requires specialized CAD tools, and thus can create tool interface problems when used in a standard cell ASIC. For example, the use of a gate array place and route tool for a standard cell ASIC will generally require conversion of standard cell tool infrastructure over to the gate array tool and corresponding re-training of standard cell tool users, thereby imposing a high development cost burden on what are typically only a few candidate applications. In addition, the use of programmable logic can create difficult "floor plan" issues. Other drawbacks include the fact that programmable gate array density is typically only half to less than half the density of standard cell, which affects die size and thus piece part cost, and can also impact performance.

In view of the foregoing, it is apparent that a need exists in the art for a base transistor structure that is programmable but also fully compatible with standard cell CAD tools.

SUMMARY OF THE INVENTION

The present invention solves one or more of the above-noted problems by providing a base transistor structure compatible with standard cell CAD tools.

In accordance with one aspect of the invention, a base transistor structure for use in an integrated circuit includes a number of source regions, a number of drain regions each adjacent to a corresponding one of the source regions, and at least first and second elongated gates. The first and second gates each overlie a corresponding pair of the source and drain regions, and extend longitudinally along a first axis from a first end adjacent one of the source and drain regions to a second end extending past another of the source and drain regions. The first and second gates are separated from one another at the second ends thereof. The base transistor structure is configured so as to be substantially symmetric about the first axis. One or more circuit cells of the integrated circuit can be formed by utilizing multiple base transistor structures of this type arranged immediately adjacent to one another.

By way of example, the base transistor structure may provide a pair of field effect transistors (FETs), i.e., a P-type FET (PFET) and an N-type FET (NFET), suitable for use in otherwise conventional complementary metal-oxide-semiconductor (CMOS) logic circuitry. In such an arrangement, the first and second gates of the base transistor structure correspond to gates of the respective PFET and NFET devices.

In an illustrative embodiment of the invention, the base transistor structure is symmetric about one or more axes, extends only a single grid of a standard cell CAD tool in width. In addition, the above-described split gate base transistor structure is preferably configured in a manner that permits the utilization of gate isolation to separate active transistors in adjacent base transistor structures.

Advantageously, the base transistor structure of the present invention can be used to implement a programmable cell technology that is fully compatible with standard cell CAD tools.

DETAILED DESCRIPTION OF THE INVENTION

The present invention will be described in conjunction with an illustrative base transistor structure and a number of example circuit cells that may be generated from the base transistor structure. Advantageously, the invention may be used to implement a programmable cell library comprising a large number of circuit cells, each constructed from a particular arrangement of one or more of the base transistor structures. The invention thus allows rapid and low cost design changes to be made to standard cell ASICs within an all standard cell CAD tool flow. As a result, users can make use of the positive aspects of standard cell design, including the existing tool set and designer knowledge base, while avoiding the high NRE costs and lengthy processing intervals usually required by standard cell ASICs. For example, the invention permits the distribution of programmable logic gates within a mostly standard cell core, thereby providing a new programmable cell technology which overcomes one or more of the previously-described drawbacks associated with conventional approaches.

The term "programmable" in this context is intended to include without limitation arrangements in which circuit functionality is alterable by changes in metallization layers only. For example, the base transistor structure in the illustrative embodiments of the invention described herein may be elevated to a designated metal layer, e.g., an M2 layer, using elevation studs, vias or other similar mechanisms, such that any configuration of spare gates into active gates can be implemented in the M2 layer. Similar techniques may be used to elevate the interconnections for the base transistor structures to other higher metal layers.

Figure 1A:
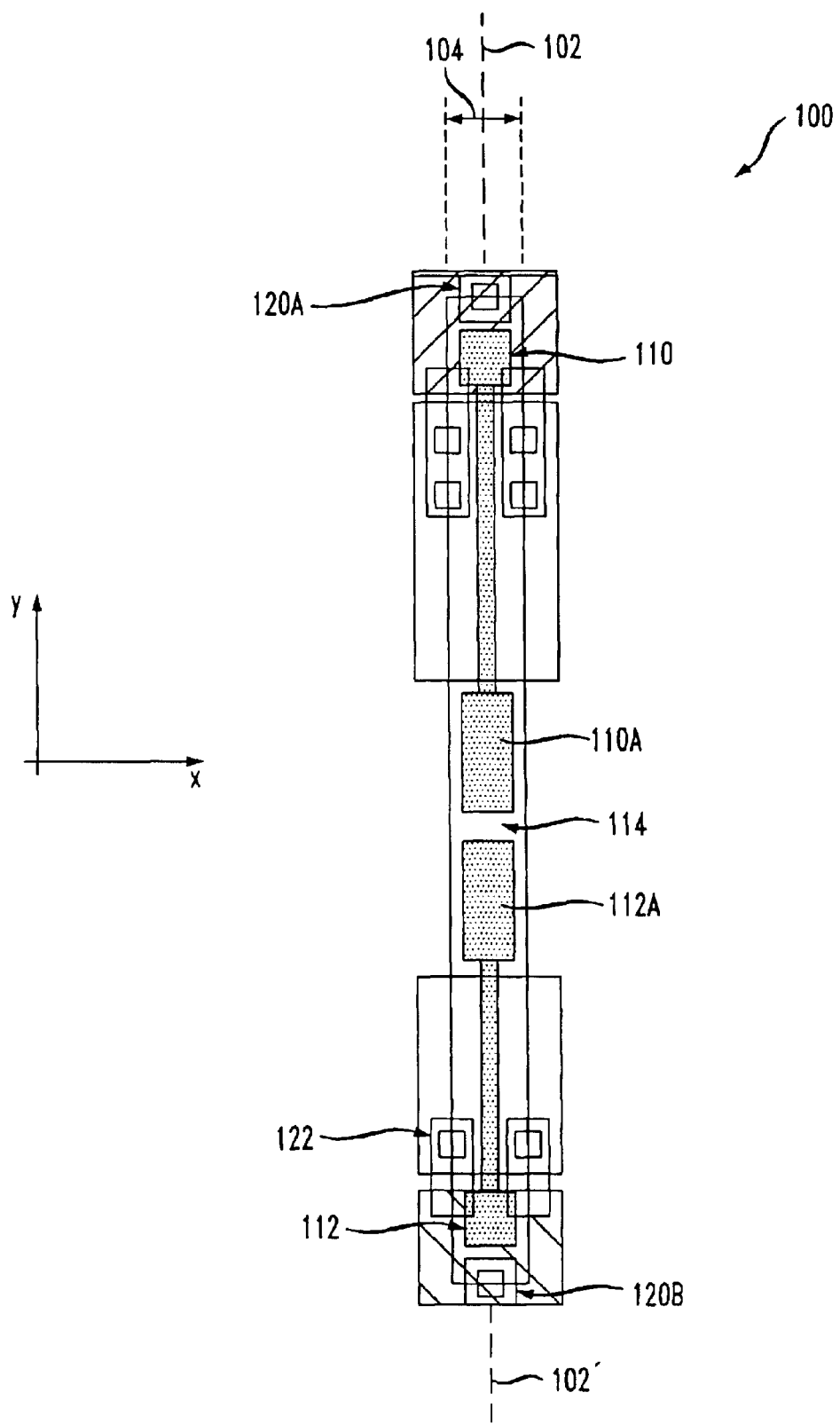
FIG. 1A shows an example base transistor structure in accordance with an illustrative embodiment of the invention.

FIG. 1A shows a base transistor structure 100 in accordance with an illustrative embodiment of the invention. As will be described in more detail below, the base transistor structure 100 is used as a building block to create circuit cells in a fully programmable manner. An integrated circuit or portion thereof may thus be implemented as multiple cells arranged in rows of base transistor structures. The base transistor structure 100 in this embodiment is symmetric about vertical dashed line 102—102' corresponding to a y-axis and has a width that corresponds approximately to an x-grid width 104 of a conventional standard cell CAD tool, e.g., a standard cell place and route tool. This single grid symmetry advantageously allows cells created from the base structure to fully emulate standard cell behavior within a standard cell CAD tool environment. The single grid symmetry is also very area efficient.

An integrated circuit comprising multiple base transistor structures arranged in rows may be assumed for illustrative purposes to be configured such that each row runs along the x-axis and one moves from one row to an adjacent row by moving along the y-axis.

The base transistor structure 100 includes a pair of split gates 110 and 112 having respective extended regions 110A and 112A separated as indicated at 114. The gate isolation that can be provided using this split gate arrangement is described in greater detail below in conjunction with FIG. 1B.

The gates extend below a power bus in order to allow transistors to be disabled and to create source and drain isolation regions. The gate extensions permit so-called "crossover" routing within cells so as to allow a more compact cell width. As is apparent from FIG. 1A, the base transistor structure 100 is uniform and symmetric. This ensures that all cell-level connections between a given set of the structures can be created by means of metal layer changes only.

In an example standard cell CAD tool environment, the cells are row based, and a given cell can move along a row in single grid increments. The cells can be flipped and rotated about the y-axis, and can be any number of grids in length. The cell outlines and pin terminals are all typically placed on a grid of the standard cell CAD tool. The base transistor structure 100 of FIG. 1A is particularly well suited for use in this type of standard cell CAD tool environment, but can also be used in other environments. More particularly, the base transistor structure 100 is preferably implemented using the above-noted single grid symmetry, so as to provide full compatibility with standard cell CAD tools.

The base transistor structure 100 includes a number of well ties implemented as indicated generally at 120A and 120B. These well ties are preferably shared between rows of a given cell. More particularly, in an embodiment which includes multiple rows of cells each formed from one or more of the base transistor structures 100, the upper well tie 120A associated with a particular base transistor structure in a given row also serves as the lower well tie in a corresponding base transistor structure in the row immediately above the given row, while the lower well tie 120B associated with the particular base transistor structure in the given row also serves as the upper well tie in the row immediately below the given row. The metallization as shown generally at 122 is included in the figure for reference purposes only, and may be considered at least in part as separate from the base transistor structure 100.

The base transistor structure 100 of FIG. 1A may be viewed, by way of example and without limitation, as providing a pair of field effect transistors (FETs), i.e., a P-type FET (PFET) and an N-type FET (NFET), suitable for use in otherwise conventional complementary metal-oxide-semiconductor (CMOS) logic circuitry. The gates 110 and 112 of the base transistor structure may therefore correspond to gates of the respective PFET and NFET devices, with similar correspondence between source and drain elements of the base transistor structure and source and drain elements of the respective PFET and NFET devices. When arranged in rows, the base transistor structures may be configured such that the PFET devices in one row are adjacent PFET devices in an adjacent row, while the NFET devices in one row are adjacent NFET devices in another row. For example, if the upper device associated with a particular base transistor structure in a given row is a PFET device and the lower device associated with the particular base transistor structure in the given row is an NFET device, the lower device in a corresponding base transistor structure in the row immediately above the given row is preferably a PFET device, while the upper device in a corresponding base transistor structure in the row immediately below the given row is an NFET device, and so on for the other base transistor structures. Such an arrangement facilitates the previously-described sharing of well ties.

The particular base transistor structure shown in FIG. 1A is by way of illustration only. Those skilled in the art will recognize that the structure in alternative embodiments may be symmetric about both x and y axes, may have a width other than a single x-grid width, may include gate structures and other transistor structures which differ from those specifically shown, and may be otherwise reconfigured to meet the needs of a particular application.

It should be noted that the transistor devices of the base transistor structure 100 may be constructed using conventional techniques of a type well-known in the art. The base transistor structure in cross-section will therefore be of a type consistent with these well-known conventional techniques, and is therefore not explicitly shown or described herein.

As noted above, the single grid symmetry in the illustrative transistor base structure of FIG. 1A ensures that a library of circuit cells created from the base transistor structure can fully emulate standard cell behavior within a standard cell CAD tool environment. In the illustrative embodiment, cells are created from a particular arrangement of multiple base transistor structures, and as a result any cell can be replaced by another cell in a standard cell placement operation implemented by a standard cell CAD tool. In addition, the cells can be flipped, rotated, and mirrored on one or more axes by changing only upper programmable metal layers of the circuit design.

Figure 1B:
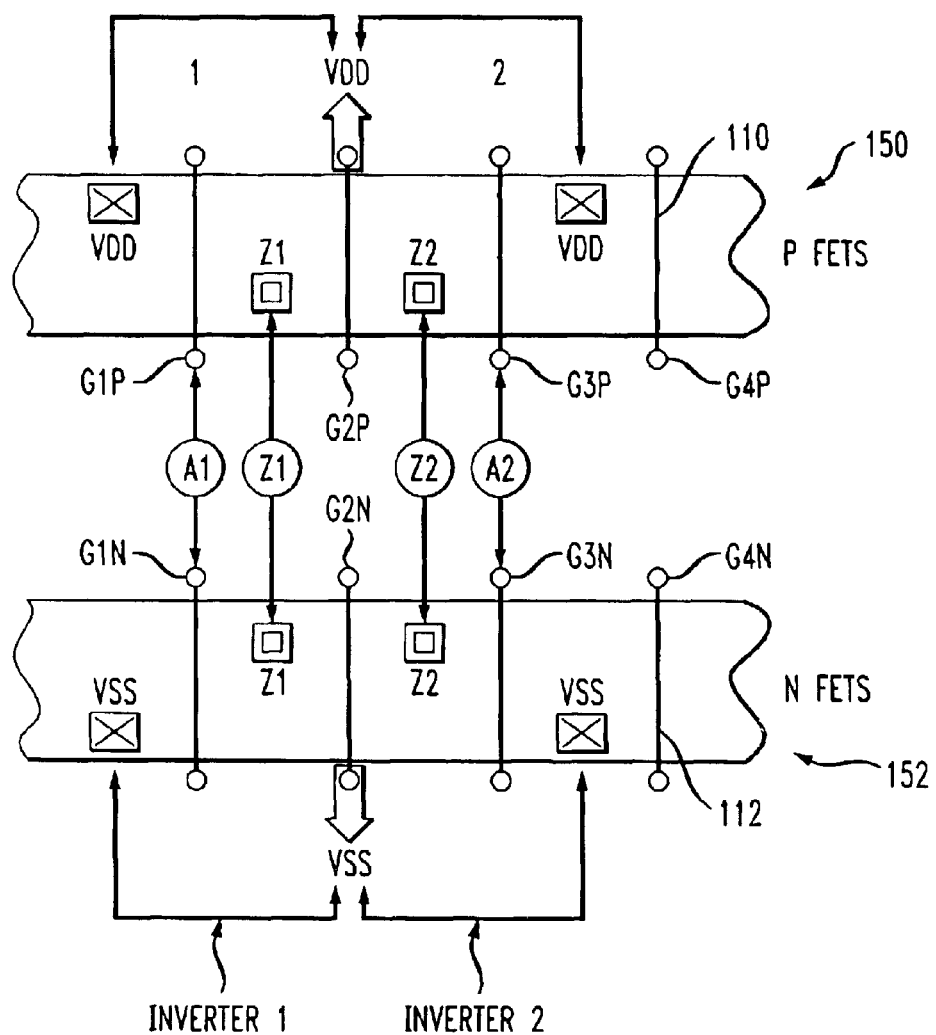
FIG. 1B is a diagram illustrating gate isolation provided using an arrangement of multiple base transistor structures of the type shown in FIG. 1A.

FIG. 1B illustrates the gate isolation provided in an example arrangement of multiple base transistor structures 100. In this figure, four of the base transistor structures 100 are illustrated as being arranged adjacent to one another in a row. It should be understood that a given row will generally include more than four base transistor structures, and may include less, but four are shown for illustrative purposes. Moreover, the structures are shown in simplified form in FIG. 1B for clarity of illustration, although it is to be appreciated that each of the structures may be configured as shown in FIG. 1A.

Each of the four exemplary structures shown includes a pair of split gates 110 and 112, and collectively the base transistor structures provide a set of PFET devices 150 and a set of NFET devices 152 in this example. The PFET devices 150 are implemented as the upper devices in the base transistor structures, and the NFET devices 152 are implemented as the lower devices. The gate terminals for the four PFET devices are denoted G1P, G2P, G3P and G4P, and the gate terminals for the four NFET devices are denoted G1N, G2N, G3N and G4N. The four base transistor structures are utilized to implement first and second inverters denoted respectively as Inverter 1 and Inverter 2 in the figure.

The above-noted segmentation of the gate structure into the split gates 110, 112 provides an efficient mechanism for implementing gate isolation between adjacent transistors In the horizontal direction, i.e., in the direction of the x-axis in this example. More particularly, in this example, gates G1P and G1N are active and comprise the first inverter, i.e. Inverter 1, while the gates G3P and G3N are active and comprise the second inverter, i.e. Inverter 2. The gates corresponding to Inverter 1 and Inverter 2 are also denoted A1 and A2 respectively, in the figure. The gates G2P and G2N in this example are used as isolating gates. These gates electrically separate the transistor source and drain regions Z1 of Inverter 1 from the source and drain regions Z2 of Inverter 2 in the direction of the x-axis, in both the PFET and NFET regions. This isolation is achieved In this example by tying G2P to the upper supply voltage VDD and G2N to the lower supply voltage VSS as shown. The split gate structure comprising gates G2P and G2N prevents the shorting of the VDD supply voltage. As indicated above, this arrangement isolates the source and drain regions Z1 of the first inverter from the source and drain regions Z2 of the second inverter. Similar isolation techniques can be Implemented using other arrangements involving the base transistor structure of FIG. 1A.

Figure 2A:
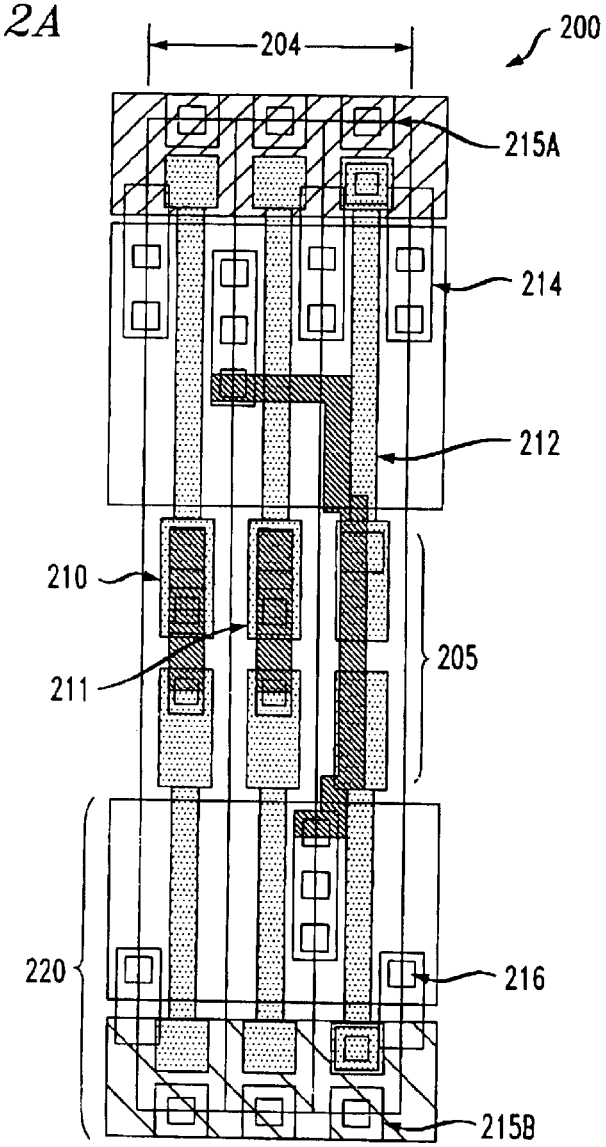
FIG. 2A shows a two-input NAND gate cell formed using the base transistor structure of FIG. 1A.
Figure 2B:
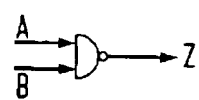
FIGS. 2B and 2C show logic and schematic diagrams for the two-input NAND gate cell of FIG. 2A.
Figure 2C:
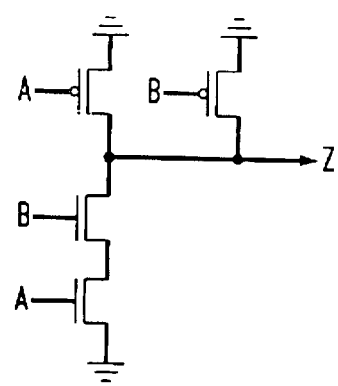

FIG. 2A shows an example two-input NAND gate cell 200 formed using the base transistor structure of FIG. 1A. Corresponding logic and schematic diagrams for the cell are shown in FIGS. 2B and 2C, respectively. The cell 200 is formed using three of the base transistor structures shown FIG. 1A. The cell 200 has a width as indicated at 204 that corresponds approximately to three x-grid widths. A set of terminals 205 are arranged on the grid of the standard cell CAD tool. Element 210 in the set of terminals 205 denotes the A input terminal and it can be seen that the gates of the corresponding base transistor structure are tied together. Element 211 in the set of terminals 205 denotes the B terminal and is implemented in a similar manner. Element 212 indicates generally an output connection made in metal. Windows and contacts to source, drain and gate terminals such as that indicated generally at 214 are fully customizable. Elements 215A and 215B denote shared well ties. The configuration of element 216 is exemplary of the preferred utilization of common boundary conditions in both x and y dimensions, thereby maximizing sharing of circuit elements and reducing area requirements. As indicated generally at 220, shared source and drain regions are created by the abutment of the three base transistor structures, thereby reducing width of the cell and further reducing area requirements.

Figure 3:
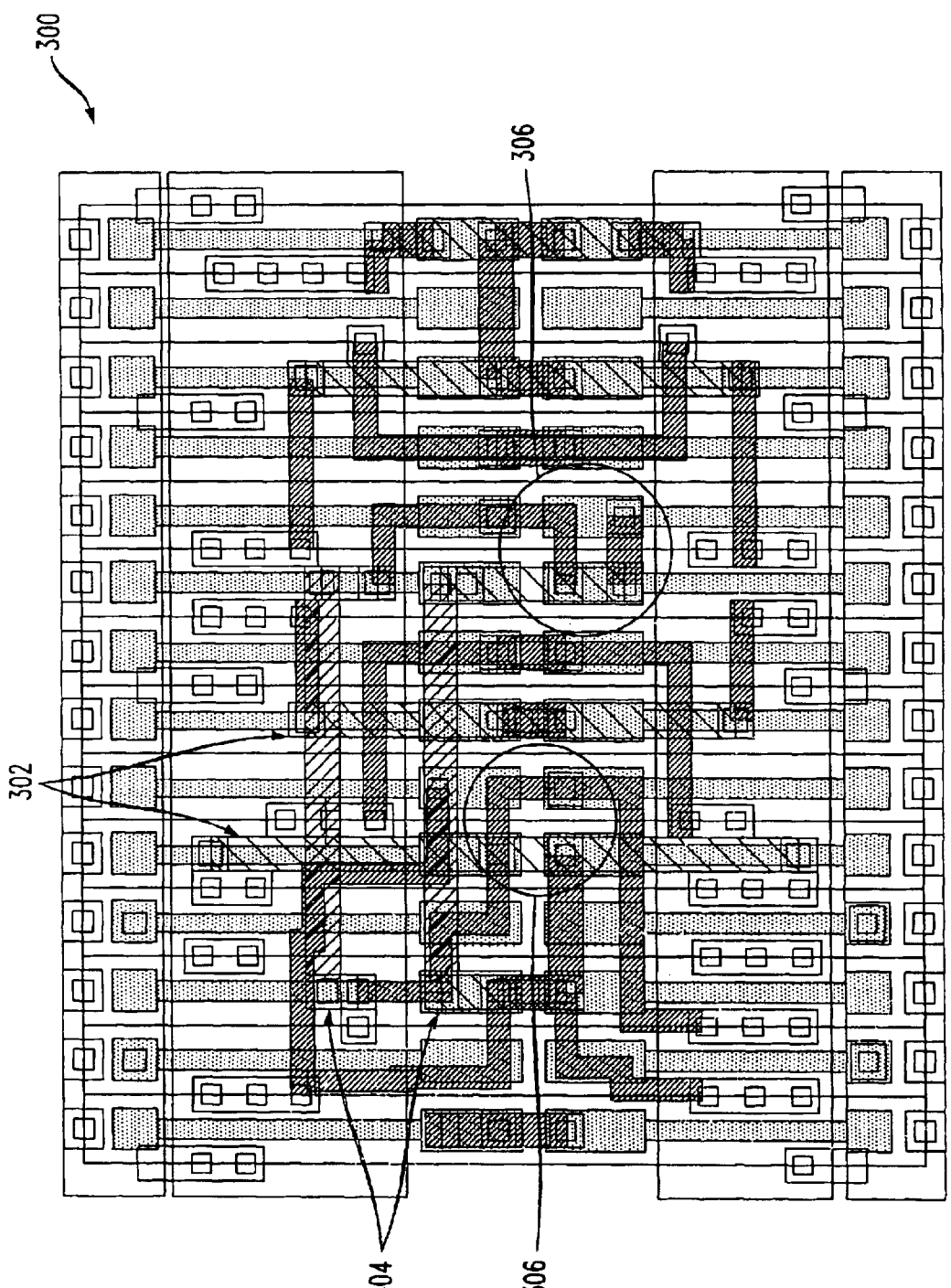
FIG. 3 shows a D-type flip-flop cell formed using the base transistor structure of FIG. 1A.

FIG. 3 shows a D-type flip-flop cell formed using the base transistor structure of FIG. 1A. In this example cell, the D-type flip-flop is formed using an arrangement of fourteen of the base transistor structures of FIG. 1A. The width of this cell thus corresponds approximately to fourteen x-grid widths. It should be noted that a cell constructed using the example base transistor structure can generally have a width corresponding to any integral number of grid widths, even or odd. As indicated generally at 302, M2 metallization routes are used within the cell and are placed on the grid of the standard cell CAD tool environment. As indicated generally at 304, M3 metallization routes are also used within the cell and are placed on the grid of the standard cell CAD tool environment.

Element 306 indicates generally areas in which the above-mentioned "crossover" routing is used on extended gates.

As indicated previously, the present invention can be implemented in the form of an integrated circuit comprising one or more cells each constructed from an arrangement of multiple base transistor structures.

A given integrated circuit constructed using the techniques of the invention can include cells constructed from the above-described base transistor structure in combination with other types of conventional cells. For example, in one possible implementation of the invention, one or more base transistor structure cells of the type described above can be included as spare gates in an ASIC or other integrated circuit design otherwise comprised entirely of conventional standard cells. The base transistor structure cells can be added to an original standard cell design in the form of, e.g., unused rows or modules of unused base transistors arranged between rows of standard cells. The spare gate rows or modules are preferably incorporated into a given integrated circuit design using a fixed, uniform distribution. For example, rectangular modules each of which occupies a portion of a standard cell row and a portion of a standard cell column may be laid out in a checkerboard-type pattern. The spare gate transistors can later be converted to active gates when needed.

Advantageously, the invention allows any new cell type to be created at any spare gate location in the design, thereby improving design flexibility and CAD tool flow.

As a more particular example, after standard cell rows are created, the rows may be modified by removing and repositioning them such that an interleaved structure of standard cell rows and base transistor structure cell rows results. This pattern may be repeated throughout a core area of the circuit, although it should be noted that spare gates in accordance with the invention can also be placed in an otherwise empty space of an integrated circuit, e.g., around the outside of the core, in order to improve yield. The ratio of the different types of cells may be one row of base transistor structure cells for every 20 rows of standard cells, although the specific ratio will of course vary depending upon the application. Typically the circuit will include about 80% to 95% standard cell content by area. Design changes may be implemented by first modifying the corresponding netlist, locking the standard cells into place, and then performing a place and route operation using a standard cell CAD tool. Design changes up to many thousands of gates can be implemented in a particularly efficient manner using this technique.

A significant advantage of this approach is that the unused spare gates do not require any netlist content. Only those spare gates that are actually converted to active gates become part of the netlist, which reduces the size of the netlist and simplifies netlist processing operations.

It should be noted that, in an embodiment in which there is primarily standard cell content, at least one of the x-grid and y-grid of the spare gates may differ from that of the standard cells.

As another example, an ASIC or other integrated circuit design can be implemented entirely with base transistor structure cells of the type described above with the exception of one or more particular conventional standard cell types, e.g., the integrated circuit design can be implemented using standard cell flip-flops of a particular type but otherwise using base transistor structure cells.

For example, a circuit netlist may be created such that a particular percentage of the flip-flops of the circuit, e.g., 70% of the flip-flops, are standard cell flip-flops, while the remaining 30% of the flip-flops are base transistor structure cell flip-flops. The rows of cells in the design may be configured such that there is a particular ratio of base transistor structure cells to standard cells, such as two or three base transistor structure cell rows for every standard cell row. Again, the particular ratio of rows of cells is application dependent.

In these and other possible implementations of the invention, the base transistor structure cells of the present invention may be used to supplement the use of standard cells, or to otherwise operate in conjunction with such standard cells, in order to produce advantages in the overall design and design process. Of course, the invention can also be implemented in an integrated circuit containing only base transistor structure cells and no other standard cells.

It should also be noted that the present invention can also be implemented at least in part in the form of software that is executed on a computer, workstation or other processing device having one or more processor elements and one or more memory elements. For example, a suitable representation of the base transistor structure of FIG. 1A may be implemented in software to be used on a computer or workstation to create a cell library using the base transistor structure. As another example, a library of cells created using the base transistor structure may be stored in the form of a software file or database accessible to a CAD tool implemented on a computer or workstation in an otherwise conventional standard cell CAD environment.

The above-described embodiments of the invention are intended to be illustrative only. For example, although the invention has been illustrated in conjunction with a particular base transistor structure, this structure can be modified to exhibit different width, symmetry and component elements. Moreover, a base transistor structure in accordance with the invention can be used to implement a wide variety of circuit cells other than those explicitly described herein.

What is claimed is:

1. A base transistor structure for use in an integrated circuit, the base transistor structure comprising:
   a plurality of source regions;
   a plurality of drain regions, each adjacent to a corresponding one of the source regions; and
   at least first and second elongated gates, the first and second gates each overlying a corresponding subset of the source and drain regions, the first and second gates each extending longitudinally toward each other along a first axis from a first end adjacent one of the source and drain regions to a second end, the first and second gates being separated from one another at the second ends thereof;
   the base transistor structure being substantially symmetric about the first axis; and
   the base transistor structure being configured such that multiple ones of the base transistor structures arranged immediately adjacent to one another are utilizable to form one or more circuit cells of the integrated circuit,
   wherein the first and second elongated gates are connectable at the second ends thereof by a conductor formed in a metallization layer of the integrated circuit.

2. The base transistor structure of claim 1 wherein the first and second gates are associated with respective PFET and NFET devices of the base transistor structure.

3. The base transistor structure of claim 1 wherein at least one of the multiple ones of the base transistor structures, arranged immediately adjacent one another, is configurable to provide gate isolation for active transistors in other ones of the base transistor structures.

4. The base transistor structure of claim 1 wherein the first axis corresponds to a y-axis.

5. The base transistor structure of claim 1 wherein the base transistor structure is substantially symmetric about a second axis perpendicular to the first axis.

6. The base transistor structure of claim 1 having a width corresponding approximately to a single grid of a standard cell CAD tool.

7. The base transistor structure of claim 1 wherein the gates are configured so as to permit crossover routing of interconnects within a given one of the circuit cells.

8. The base transistor structure of claim 1 wherein metallization layer connections of the integrated circuit are used to form the circuit cells from the multiple ones of the base transistor structures.

9. The base transistor structure of claim 1 wherein the circuit cells comprise programmable cells of a cell library having a plurality of cells each of which is comprised of multiple ones of the base transistor structure.

10. The base transistor structure of claim 1 wherein a given one of the circuit cells comprises a logic gate formed from a plurality of the base transistor structures.

11. The base transistor structure of claim 1 wherein a given one of the circuit cells comprises a flip-flop circuit formed from a plurality of the base transistor structures.

12. The base transistor structure of claim 1 wherein a plurality of the circuit cells comprise spare gates of the integrated circuit, the spare gates being convertible to active gates using connections formed in a metallization layer of the integrated circuit.

13. The base transistor structure of claim 12 wherein the spare gates are arranged in rows of unused transistors each having the base transistor structure, the rows of unused transistors being interspersed with one or more rows of standard circuit cells.

14. The base transistor structure of claim 1 wherein the circuit cells of the integrated circuit comprise a first plurality of circuit cells each comprising interconnected ones of the base transistor structure and a second plurality of circuit cells each comprising a standard cell not comprising interconnected ones of the base transistor structure.

15. The base transistor structure of claim 14 wherein the second plurality of circuit cells comprise circuit cells of at least a designated type.

16. The base transistor structure of claim 15 wherein the circuit cells of the designated type comprise standard cell flip-flop circuit cells.

17. An integrated circuit comprising:
  a plurality of circuit cells, each of at least a subset of the plurality of circuit cells being formed as an interconnection of multiple base transistor structures arranged immediately adjacent to one another;
  a given one of the base transistor structures comprising:
    a plurality of source regions;
    a plurality of drain regions, each adjacent to a corresponding one of the source regions; and
    at least first and second elongated gates, the first and second gates each overlying a corresponding subset of the source and drain regions, the first and second gates each extending longitudinally along a first axis toward each other from a first end adjacent one of the source and drain regions to a second end, the first and second gates being separated from one another at the second ends thereof;
    the base transistor structure being substantially symmetric about the first axis,
  wherein the first and second elongated gates are connectable at the second ends thereof by a conductor formed in a metallization layer of the integrated circuit.

18. A circuit cell within an integrated circuit comprising:
  at least first, second, and third base transistor structures arranged immediately adjacent to one another, each base transistor structure comprising:
    a plurality of source/drain regions;
    at least first and second elongated gates, the first and second gates each overlying a subset of the source/drain regions, the first and second gates each extending longitudinally along a first axis toward each other from a first end adjacent one of the subsets of the source/drain regions to a second end, the first and second gates being separated from one another at the second ends thereof;
  wherein the source/drain regions underlying the first gate of the first base transistor structure and the source/drain regions underlying the first gate of the second base transistor structure share a same region, and the source/drain regions underlying the second gate of the first base transistor structure and the source/drain regions underlying the second gate of the second base transistor structure share a same region;
  wherein the source/drain regions underlying the first gate of the second base transistor structure and the source/drain regions underlying the first gate of the third base transistor structure share a same region, and the source/drain regions underlying the second gate of the second base transistor structure and the source/drain regions underlying the second gate of the third base transistor structure share a same region; and
  wherein the first and second gates of the second base transistor structure are operable to electrically isolate the source/drain regions of the first base transistor structure from the source/drain regions of the third base transistor structure.

19. The base transistor structure of claim 18 wherein the first and second elongated gates of each base transistor structure are connectable at the second ends thereof by a conductor formed in a metallization layer of the integrated circuit.

* * * * *